United States Patent
Mohanty et al.

(10) Patent No.: US 8,314,665 B2
(45) Date of Patent: Nov. 20, 2012

(54) NANO ELECTROMECHANICAL INTEGRATED-CIRCUIT FILTER

(75) Inventors: Pritiraj Mohanty, Los Angeles, CA (US); Robert L. Badzey, Quincy, MA (US); Alexei Gaidarzhy, Allston, MA (US)

(73) Assignee: Trustees of Boston University, Boston, MA (US)

( * ) Notice: Subject to any disclaimer, the term of this patent is extended or adjusted under 35 U.S.C. 154(b) by 557 days.

(21) Appl. No.: 12/311,141

(22) PCT Filed: Sep. 20, 2007

(86) PCT No.: PCT/US2007/079059
§ 371 (c)(1),
(2), (4) Date: Sep. 22, 2009

(87) PCT Pub. No.: WO2008/036830
PCT Pub. Date: Mar. 27, 2008

(65) Prior Publication Data
US 2010/0007443 A1 Jan. 14, 2010

Related U.S. Application Data

(60) Provisional application No. 60/846,129, filed on Sep. 20, 2006.

(51) Int. Cl.
*H03H 9/24* (2006.01)
*H03H 9/46* (2006.01)

(52) U.S. Cl. ........ 333/186; 333/197; 333/200; 257/415; 977/701; 977/932

(58) Field of Classification Search .......... 333/186–192, 333/197, 200; 257/415; 977/701, 932
See application file for complete search history.

(56) References Cited

U.S. PATENT DOCUMENTS

| | | | |
|---|---|---|---|
| 5,914,553 | A | 6/1999 | Adams et al. |
| 6,124,765 | A | 9/2000 | Chan et al. |
| 6,577,040 | B2 | 6/2003 | Nguyen |
| 6,710,680 | B2 | 3/2004 | Niu et al. |
| 6,737,939 | B2 * | 5/2004 | Hoppe et al. ............ 333/186 |
| 6,739,190 | B2 | 5/2004 | Hsu et al. |
| 6,831,531 | B1 | 12/2004 | Giousouf et al. |

(Continued)

FOREIGN PATENT DOCUMENTS
WO WO 98/01948 A1 1/1998
(Continued)

OTHER PUBLICATIONS
International Search Report and Written Opinion, from PCT/US07/79059, mailed Mar. 14, 2008.
(Continued)

*Primary Examiner* — Barbara Summons
(74) *Attorney, Agent, or Firm* — Wolf, Greenfield & Sacks, P.C.

(57) ABSTRACT

A nano electromechanical integrated circuit filter and method of making. The filter comprises a silicon substrate; a sacrificial layer; a device layer including at least one resonator, wherein the resonator includes sub-micron excitable elements and wherein the at least one resonator possess a fundamental mode frequency as well as a collective mode frequency and wherein the collective mode frequency of the at least one resonator is determined by the fundamental frequency of the sub-micron elements.

19 Claims, 15 Drawing Sheets

U.S. PATENT DOCUMENTS

| | | | |
|---|---|---|---|
| 6,859,113 B2 | 2/2005 | Giousouf et al. | |
| 6,861,914 B2 | 3/2005 | Photiadis et al. | |
| 6,909,221 B2 | 6/2005 | Ayazi et al. | |
| 6,943,484 B2 | 9/2005 | Clark et al. | |
| 6,947,719 B2 | 9/2005 | Buchaillot et al. | |
| 6,954,020 B2 | 10/2005 | Ma et al. | |
| 6,995,622 B2 | 2/2006 | Partridge et al. | |
| 7,005,946 B2 | 2/2006 | Duwel et al. | |
| 7,211,926 B2 | 5/2007 | Quevy et al. | |
| 7,215,061 B2 | 5/2007 | Kihara et al. | |
| 7,248,128 B2 | 7/2007 | Mattila et al. | |
| 7,352,608 B2 | 4/2008 | Mohanty et al. | |
| 7,492,241 B2 | 2/2009 | Piazza et al. | |
| 7,504,909 B2 | 3/2009 | Tada | |
| 7,724,103 B2 | 5/2010 | Feng et al. | |
| 7,791,432 B2 | 9/2010 | Piazza et al. | |
| 8,063,535 B2 * | 11/2011 | Mohanty et al. | 310/321 |
| 2003/0186672 A1 * | 10/2003 | Buchaillot et al. | 455/339 |
| 2004/0061564 A1 * | 4/2004 | Photiadis et al. | 331/156 |
| 2005/0073078 A1 | 4/2005 | Lutz et al. | |
| 2005/0158905 A1 | 7/2005 | Kubena et al. | |
| 2006/0186971 A1 | 8/2006 | Lutz et al. | |
| 2008/0047346 A1 * | 2/2008 | Vyas et al. | 73/580 |
| 2008/0143217 A1 | 6/2008 | Ho et al. | |
| 2008/0204153 A1 | 8/2008 | Yoshida et al. | |
| 2008/0272852 A1 | 11/2008 | Six | |
| 2009/0108381 A1 | 4/2009 | Buchwalter et al. | |
| 2009/0108959 A1 | 4/2009 | Piazza et al. | |
| 2009/0144963 A1 | 6/2009 | Piazza et al. | |
| 2009/0294638 A1 | 12/2009 | Mohanty et al. | |
| 2010/0134207 A1 | 6/2010 | Mohanty et al. | |
| 2010/0155883 A1 | 6/2010 | Wenzler et al. | |

FOREIGN PATENT DOCUMENTS

| | | |
|---|---|---|
| WO | WO 98/37635 A1 | 8/1998 |
| WO | WO 2006/000611 A1 | 1/2006 |
| WO | WO 2009/048468 A1 | 4/2009 |
| WO | WO 2009/134372 A2 | 11/2009 |
| WO | WO 2010/011288 A1 | 1/2010 |

OTHER PUBLICATIONS

Humad et al., "High frequency micromechanical piezo-on-silicon block resonators," Int'l Electron Devices Meeting 2003 IEDM. Technical Digest, Washington, D.C. Dec. 8-10, 2003, New York, NY: IEEE US Dec. 8, 2003, pp. 957-960.

International Search Report and International Preliminary Report on Patentability for International Application No. PCT/US2006/021298.

Piazza et al., "Low motional resistance ring-shaped contour-mode aluminum nitride piezoelectric micromechanical resonators for UHF applications," Micro Electro Mechanical Systems, 2005. MEMS 2005. 18th IEEE International Conference on Miami Beach, Florida, Jan. 30-Feb. 3, 2005, Piscataway, New Jersey, US, IEEE Jan. 30, 2005, pp. 20-23.

* cited by examiner

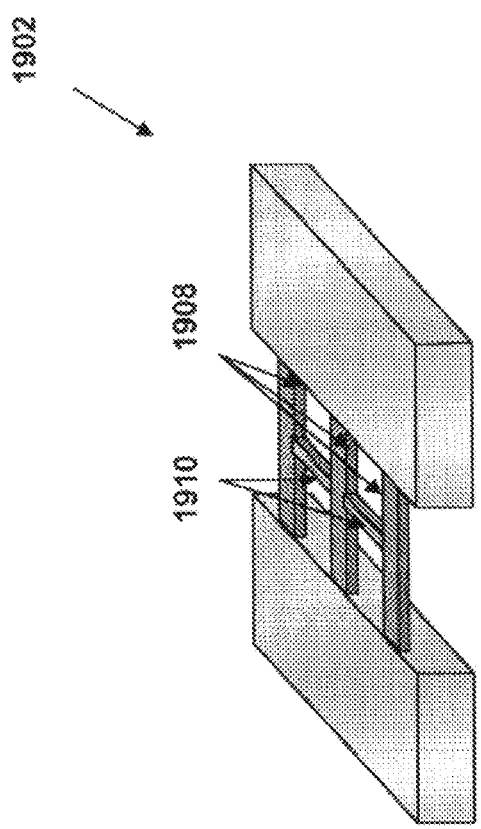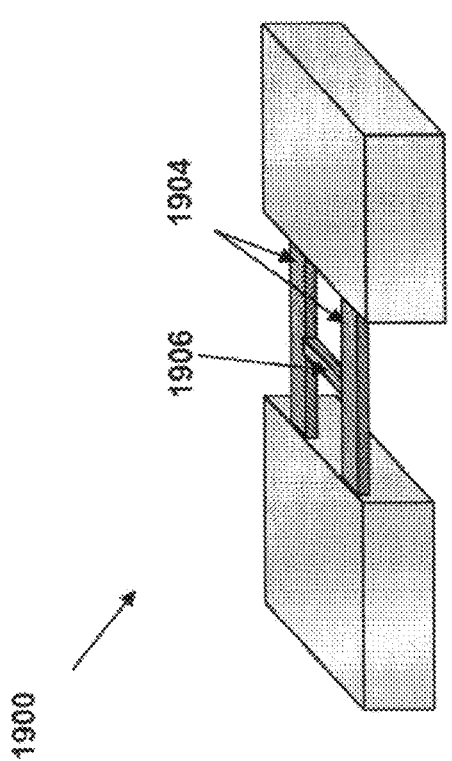
Figure 19

NANO ELECTROMECHANICAL INTEGRATED-CIRCUIT FILTER

GOVERNMENT SPONSORSHIP

This invention was sponsored by National Science Foundation Grant Nos. ECS-0404206 and DMR-0449670 and Army Research Office Grant No. DAAD19-00-2-0004 The government has certain rights in the invention.

TECHNICAL FIELD OF THE INVENTION

The present invention relates generally to electromechanical integrated circuit filters at the nanometer scale.

BACKGROUND OF THE INVENTION

Current telecommunications platforms (such as cell phones) rely on a series of radiofrequency (RF) and intermediate frequency (IF) filters in order to isolate the desired communications channel from the crowded and noisy background. Currently, surface acoustic wave (SAW), bulk acoustical wave (BAW), film bulk acoustic resonator (FBAR) and ceramic filters are the devices of choice. However, in general, these filters are large, bulky, and expensive discretely packaged components that cannot be integrated with the rest of the transceiver architecture. While the front-end module of the transceiver can and does continue to miniaturize with improving lithographic processes and designs, the filter stands as the bottleneck to a truly integrated radio package.

More and more, a greater number of communications standards (GSM, CDMA, PCS, European/US, UMTS) and features (WiFi, cameras) are being incorporated into a single handset. While this allows for truly global communications, it comes at the cost of a larger and more power-hungry device. Adding more bands and modes means that more and more discrete packages are added onboard, with corresponding increases in overall board size and power consumption due to package-to-package signal losses.

Therefore, a need exists for a type of filter that is small in size, utilizes minimal power and can be integrated with other discrete electrical elements.

BRIEF SUMMARY OF THE INVENTION

The present invention discloses a novel electromechanical integrated circuit filter at the nanometer scale. A nano electromechanical integrated circuit (IC) filter, including: a silicon substrate; a sacrificial layer; a device layer including at least one resonator, wherein the resonator includes sub-micron excitable elements and wherein the at least one resonator possess a fundamental mode frequency as well as a collective mode frequency and wherein the collective mode frequency of the at least one resonator is determined by the fundamental frequency of the sub-micron elements.

The use of a nano electromechanical filter of the present invention allows for several advantages, including the ability to integrate such a filter on a semiconductor chip with the rest of the transceiver architecture. Removing the 10-20 discrete filter packages in a typical multimode phone and replacing them with a single IC package is obviously a huge advantage. Additionally, the ability to integrate the filters onto the same chip as the RFIC allows for even more space and power savings. It will also allow for a single device to be sensitive to all relevant communications bands. Additionally, such a filter's small size allows for the replacement of the RF/IF heterodyning structure of the modern architecture with a tunable direct-channel-select filtering scheme, encompassing hundreds or thousands of individual filters. This type of filter would necessitate a massive redesign of the RF transceiver, but the dividends would be enormous. Among the advantages would be a fully integrated RF transceiver chip, drastically reducing production costs, RF board space, and power consumption. Additionally, a single RF transceiver would be capable of communicating on any band, in any channel, from 10 MHz up to 100 GHz or more. The transceiver could work in all of the cellular communications bands (GSM, CDMA, PCS, UMTS), wireless data bands (WiFi, EDGE, etc.), peripherals bands (Bluetooth), satellite radio, and GPS.

The following description and drawings set forth in detail a number of illustrative embodiments of the invention. These embodiments are indicative of but a few of the various ways in which the present invention may be utilized.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 19 illustrates two alternate filter designs.

DETAILED DESCRIPTION OF THE INVENTION

The following discussion is presented to enable a person skilled in the art to make and use the invention. The general principles described herein may be applied to embodiments and applications other than those detailed below without departing from the spirit and scope of the present invention as defined herein. The present invention is not intended to be limited to the embodiments shown, but is to be accorded the widest scope consistent with the principles and features disclosed herein.

The present invention is a radiofrequency (RF) filter based on electromechanical resonator at the nanometer scale. Because of the specific characteristics of design and construction, these nano electromechanical resonators have natural frequencies of oscillation from about 10 MHz to about 100 GHz or more, including all of the best-known analog and digital communications bands. The fabrication and perfection of such a nano scale electromechanical filter is of great significance to the telecommunications industry, yielding benefits in the size, cost, and power dissipation of radio frequency transceivers used in cellular phones, pagers, PDAs, personal computers, and any manner of wireless communications device. The construction of the resonator is such that the filter is able to cover every relevant communications frequency standard.

An element of the present invention is the compound nano electromechanical resonator described in U.S. application Ser. No. 11/813,342 with a filing date of Jul. 3, 2007, entitled "Nanomechanical Oscillator" filed by Assignee. The resonator consists of a number of sub-micron excitable elements coupled to a larger element in such a way as to possess a number of collective frequency modes of vibration. Such collective modes are characterized by all of the smaller elements moving in-phase with each other, generating a corresponding displacement in the larger element. The advantage of this configuration is an important feature of the nano electromechanical resonator. In general, it is possible to increase the natural resonant frequency of a mechanical structure by reducing its dimensions. Unfortunately, doing so also results in a much larger stiffness for the structure, which makes its oscillations much smaller in amplitude and correspondingly harder to detect. By coupling a number of these smaller, high-stiffness structures into a larger, lower-stiffness resonator, the collective modes of vibration have the frequency of the smaller elements, but the stiffness (and thus amplitude response) of a larger one. With the dimensions of the smaller elements being less than one micron ($10^{-6}$ m), the collective modes have natural frequencies from 300 MHz to 10 GHz. The dimensions of the various elements, the material composition, method of coupling, number and location of the smaller elements with respect to the larger, and type of vibration (flexural, torsional, etc.) work together to determine the exact value of the resonant frequency.

Figure 1:
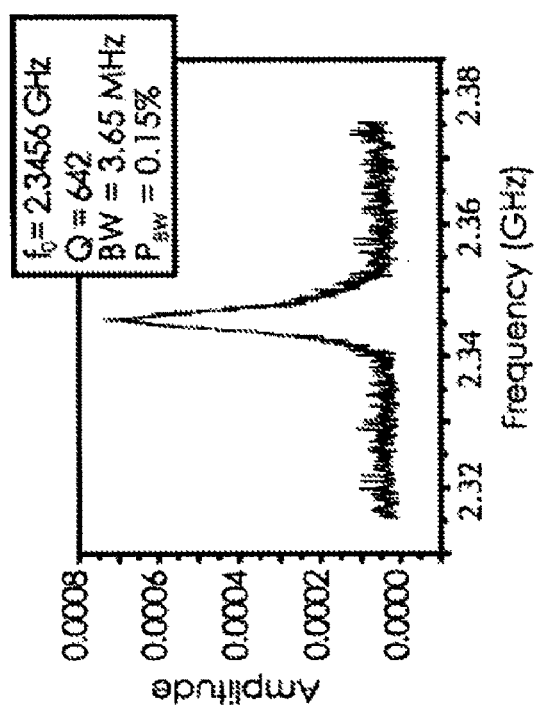
FIG. 1 illustrates an example frequency response graph of a nano electromechanical resonator.

Now referring to FIG. 1, the shape of the resonance of this damped, driven nano electromechanical resonator is shown as a Lorentzian lineshape. However, while useful in some applications, the Lorentzian is too selective to be used as a bandpass filter.

Figure 2:
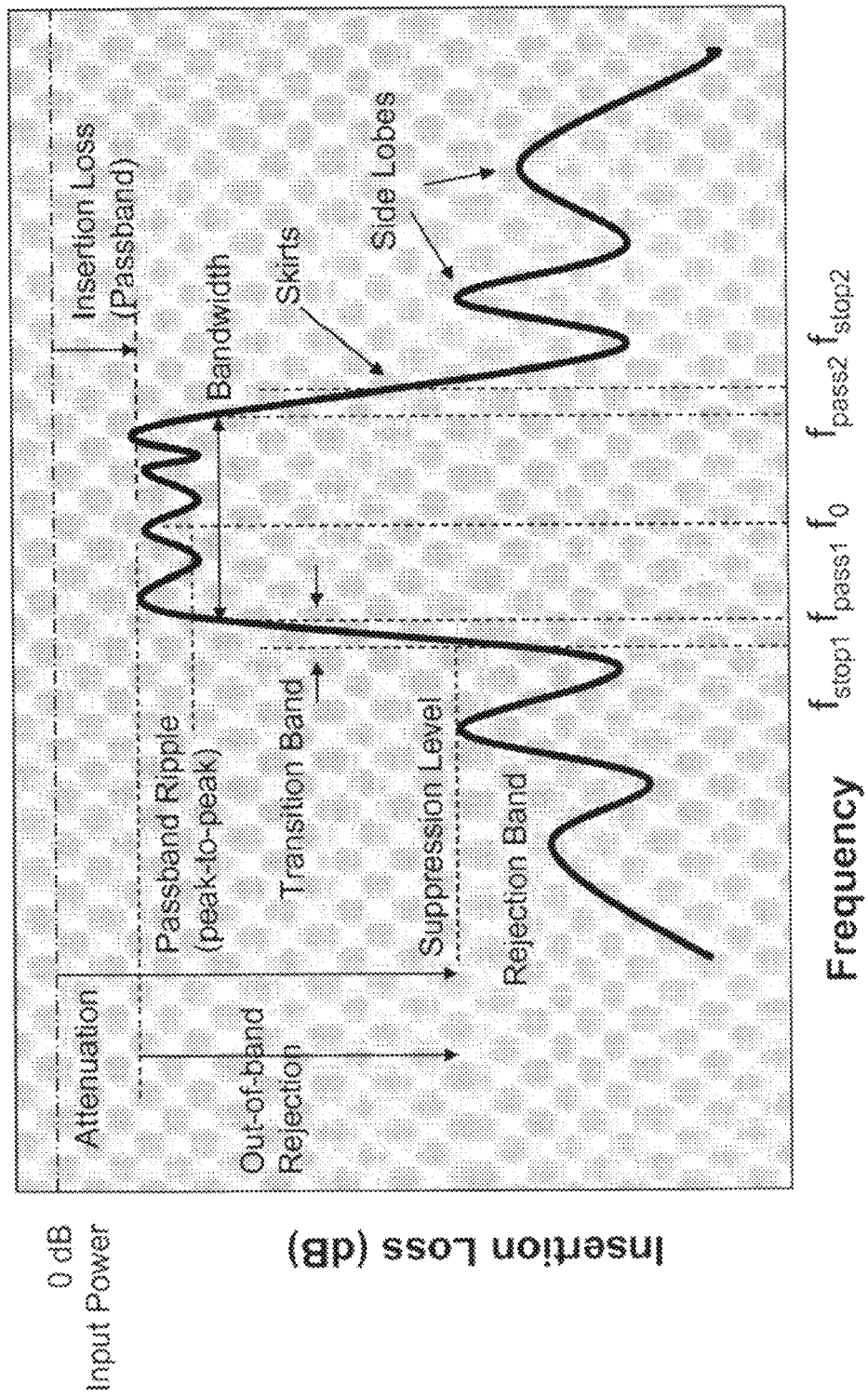
FIG. 2 illustrates an example frequency response graph of a bandpass filter.

FIG. 2 illustrates a good bandpass filter characterized by a relatively flat passband surrounded by deep and sharp sideskirts. One method of achieving such a filter is to couple two or more of these resonators together to create a suitable filter.

Figure 3:
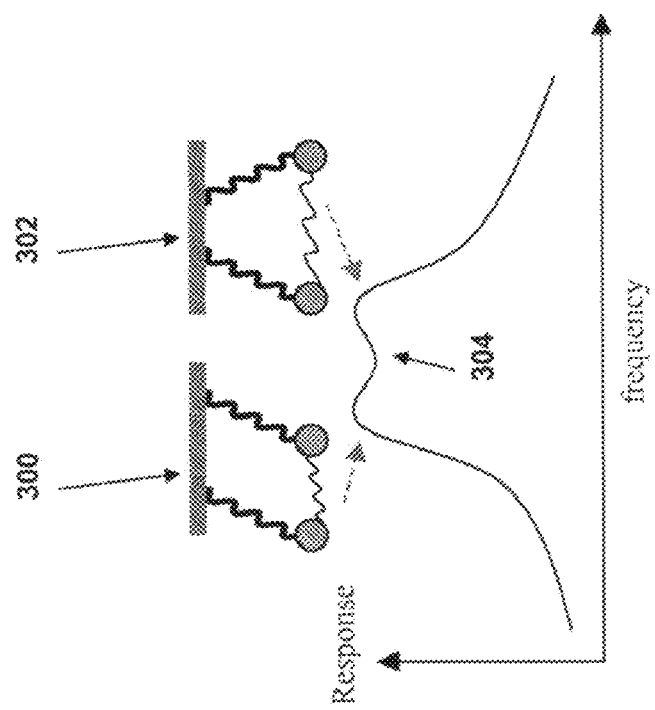
FIG. 3 illustrates an example used to explain creating a mechanical filter out of two masses.

The creation of a mechanical filter out of discrete resonating structures is illustrated in FIG. 3. Two masses connected together by a single spring will exhibit both symmetric and anti-symmetric modes of vibration. When the two masses move in the same direction 300, their motion is symmetric. When they move in opposite directions 302, the spring between them is compressed/extended and the motion is anti-symmetric. The difference between the symmetric and anti-symmetric modal frequencies is determined by the stiffness of the coupling spring. Under the right conditions, the two frequencies overlap, creating a passband 304 near the resonant frequencies of the two modes. Coupling more and more resonators to this network increases this effective passband 304.

Passband operation of a filter has been described with respect to FIG. 3. It should be appreciated that an operational frequency response of a filter is not limited to being a passband. Alternatives include high pass filters, low pass filters, notch filters, and filters with arbitrary operation frequency response.

Alteration of a passband of a filter has been described with respect to FIG. 3 by coupling resonators together. The frequency response of a filter is also tunable by causing an effective change in the stiffness of the resonator by applying one selected from one of the group consisting of mechanical strain, electrical spring softening, thermal expansion and thermal contraction. A resonator may be tuned according to operating temperature.

Figure 4:
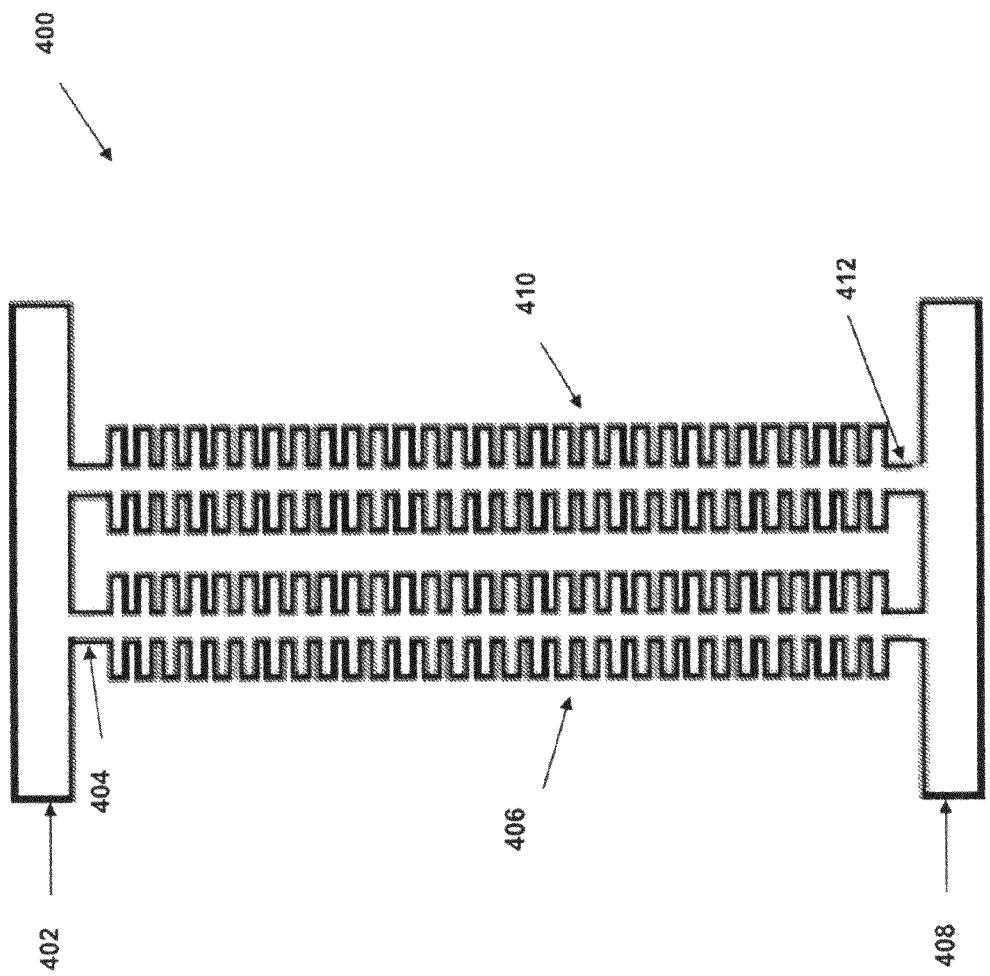
FIG. 4 illustrates one embodiment of two resonators with minor elements.

E-beam or photolithography steps are used to create one or more resonators to create a filter. The steps of one embodiment are shown in FIGS. 5-10. In general, the processing steps are similar to standard CMOS procedures used to create semiconductor integrated circuits. However, the fabrication of the filter of the present invention alters the fabrication and design process slightly. FIG. 4 illustrates one embodiment of a filter 400. This embodiment of a filter 400 includes two resonators 404, 412, and each resonator includes numerous paddles, or minor elements 406, 410. Both resonators 404, 412 are suspended over a substrate (shown in FIG. 10) and attached to the substrate by coupling elements 402, 408.

One complication of the fabrication process is due to the inclusion of the coupling beam or beams 402, 408. The coupling elements 402, 408 add extra difficulty to the fabrication of the filter 400, as these coupling elements 402, 408 need to be free of electrical contacts in order to preserve each resonators' 404, 412 independence. Additionally, the structure of the coupling elements cannot interrupt the array of minor elements 406, 410, as it is the strain coupling between these elements 406, 410 which allows for the generation of the high-frequency collective modes. One implementation of the coupling elements 402, 408 can be at the clamping points of the individual resonators 404, 412 (where the suspended resonator meets the unsuspended support structure shown in detail in FIG. 10). The coupling elements 402, 408 can be modified by changing the depth of the undercut and the separation between the participating resonators 404, 412. Alternatively, the coupling elements 402, 408 between the resonators 404, 412 need not be mechanical in nature—it can be capacitive, electrostatic, optical, thermomechanical, magnetic, piezoelectric/resistive, or electrodynamic.

Now, the process to create a simplified resonator will be described as illustrated in FIGS. 5-10. In this embodiment, a resonator is fabricated from silicon on a silicon-on-insulator (SOI) wafer, using a single lithography layer. The method in this embodiment of fabrication, a nano electromechanical structure includes a series of pattern/mask definitions, material deposition and etching processes. Now referring to FIG. 5, creating a silicon nano electromechanical resonator starts with an epitaxially-grown wafer 508 with required thickness of silicon 504 on top of a certain thickness of silicon oxide 506, used as the sacrificial layer. The wafer is then spin-coated with a trilayer PMMA 502. Then, the structure patterning is created by e-beam 500 lithography.

Figure 6:
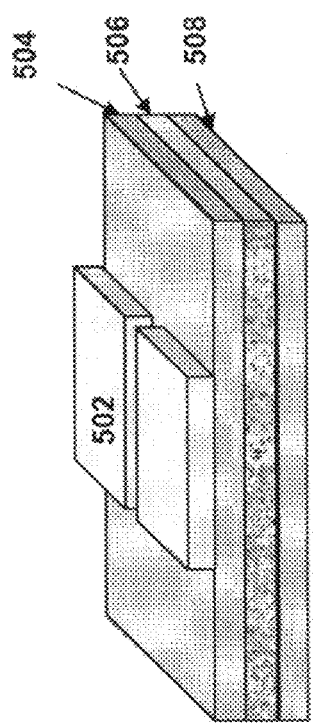
FIGS. 5-10 illustrate one method of fabricating a single beam resonator.

The wafer and pattern is then developed to create the patterned PMMA 502 as shown in FIG. 6.

Figure 7:
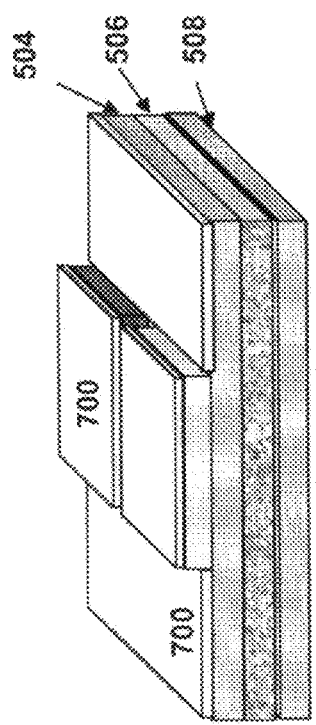
Figure 5:
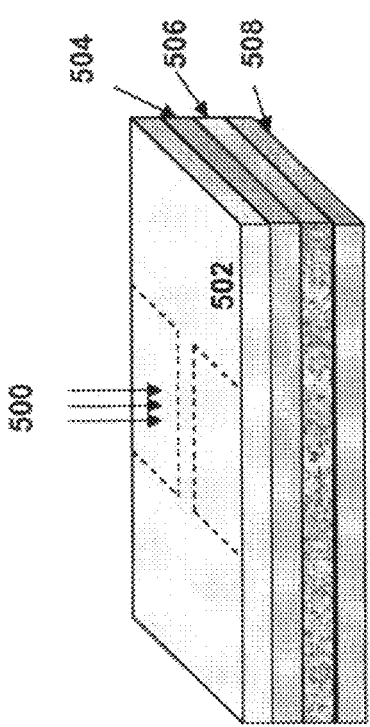

After e-beam exposure and development, a selective metal mask 700 is evaporated as shown in FIG. 7.

Figure 8:
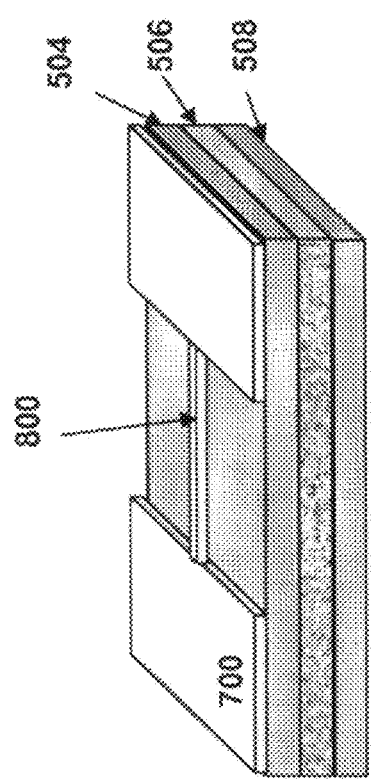

The process then includes a liftoff technique to create the structure shown in FIG. 8, which includes a single beam 800.

Figure 9:
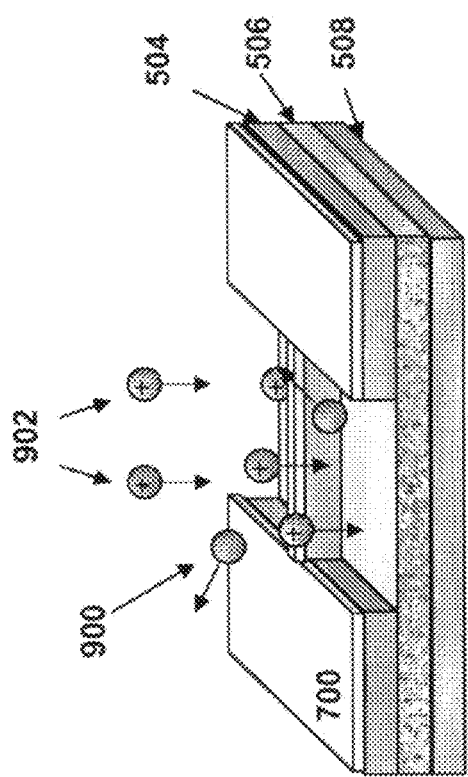

As shown in FIG. 9, a directional anisotropic etch is then done by a reactive ion etch (RIE) process with positive 902 as well negative 900 particles, until the sacrificial layer 506 is completely etched out from under the beam 800. In this embodiment, the undercut is obtained by a second isotropic RIE etch (with a different gas) or by a wet acid etch. In case of a wet acid etch, a critical-point drying process allows suspension and release of the structure without buckling. In addition, the fabrication process is designed to accommodate additional electrical lines.

Figure 10:
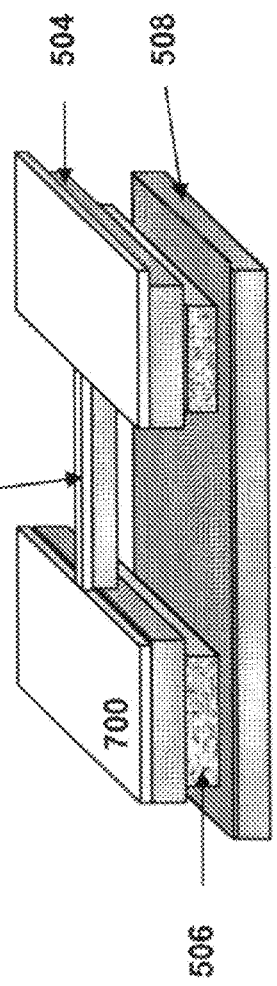

The final structure is shown in FIG. 10 with the beam 500 suspended over the silicon substrate 508.

While the embodiment of FIGS. 5-10 utilize lithographically with an electron-beam source, photolithography can also be used as the device dimensions are well within the feature size designated by the new deep-UV sources and masks, as well as nano imprint lithography, self assembled techniques, bottom up chemical techniques and other similar nano fabrication techniques. In general however, the fabrication steps for this embodiment were accomplished with well-established methods in the semiconductor industry. However, other embodiments can be fabricated from pure metals, metallic alloys, alternative semiconductor compositions such as silicon carbide (SiC), GaAs, lithium tantalite, lithium niobate, diamond, metal/semiconductor or other similar compounds or any combination of the above. Quartz, aluminum nitride or other related materials may also be used for piezoelectric actuation and detection.

Figure 11:
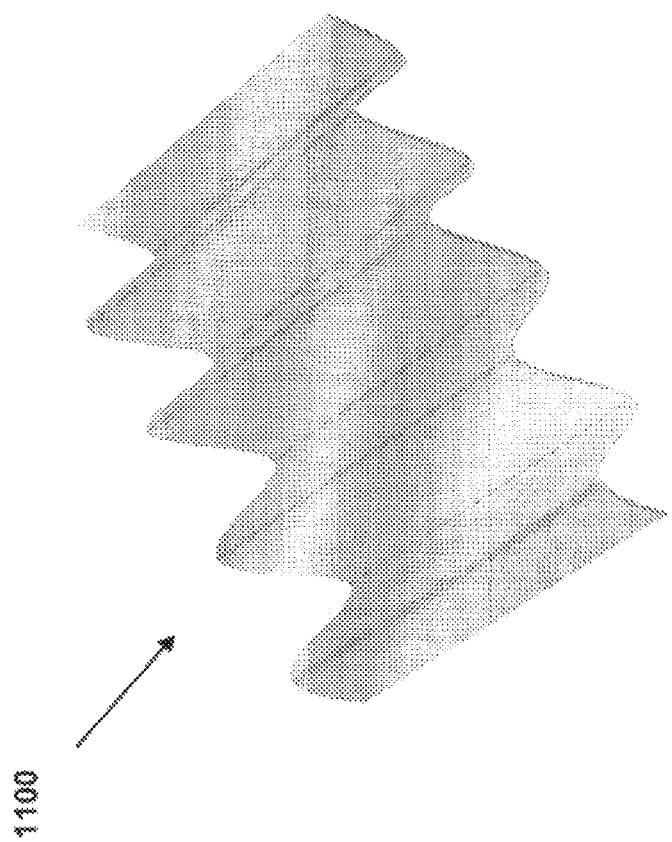
FIGS. 11-14 illustrate alternate designs of a spring like resonator.

FIG. 11 illustrates an alternate design 1100 of the beam like structure of the previous embodiment. However, instead of being a straight beam (element 800 shown in FIG. 8), this embodiment is a wavelike structure when viewed from its side.

Figure 12:
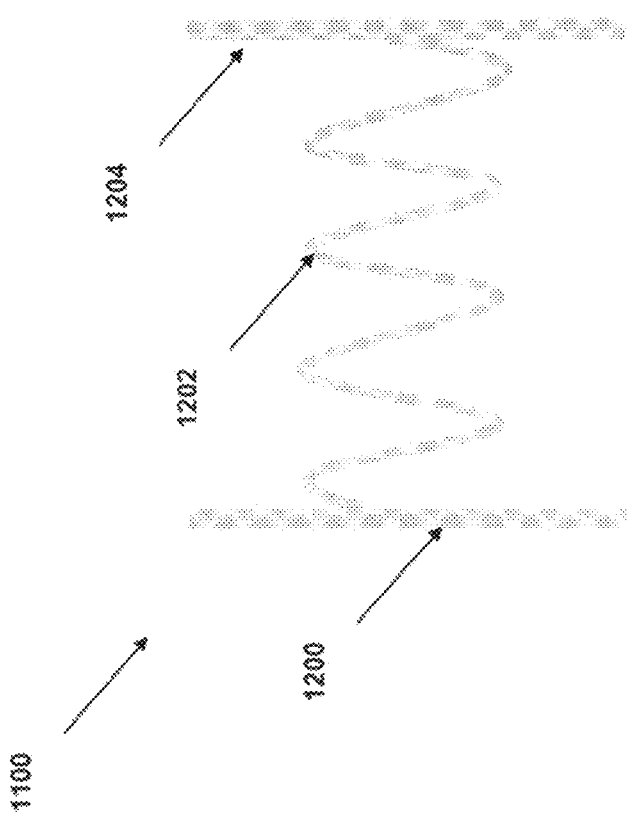

FIG. 12 illustrates the alternate design 1100 of the wavelike structure, but from a top view point. Now, the structure 1202 appears to be spring-like in shape. However, this spring structure 1202 exhibits longitudinal in-plane modes, rather than transverse modes. In addition, this spring structure design can accommodate more power than the single beam structure of the previous embodiment. However, this spring structure 1202 is attached to coupling elements 1200, 1204 similar to the coupling elements in the previous embodiment.

Figure 13:
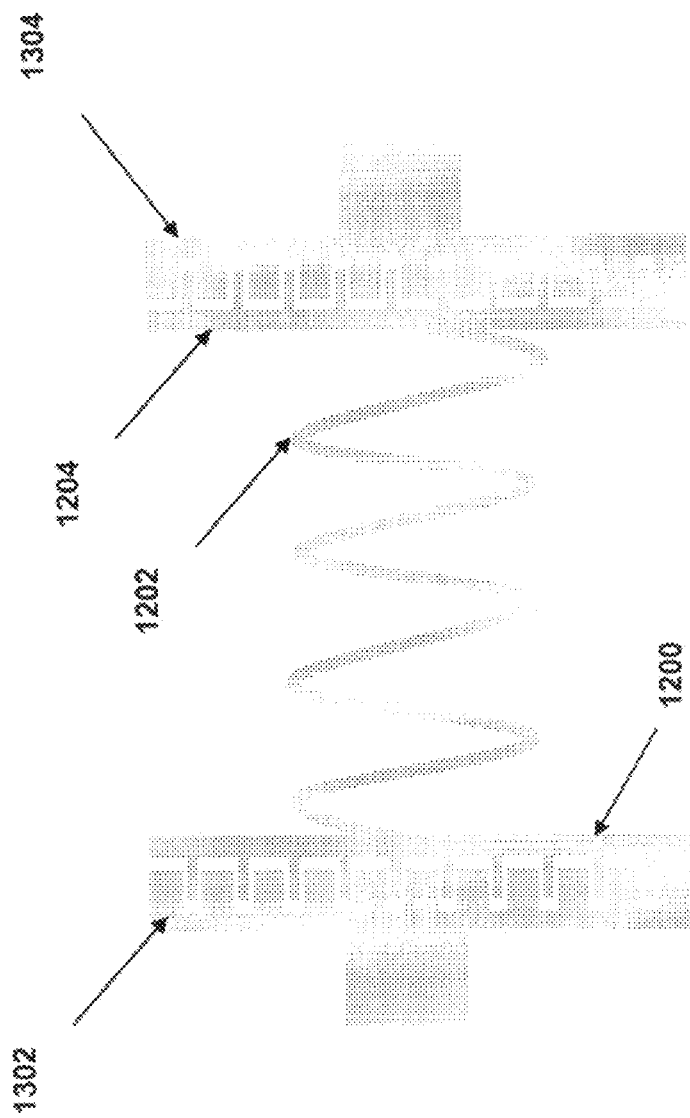

FIG. 13 illustrates the spring structure 1202, with coupling elements 1200, 1204 and actuators 1302, 1304 that can be used to excite the spring structure 1202.

Figure 14:
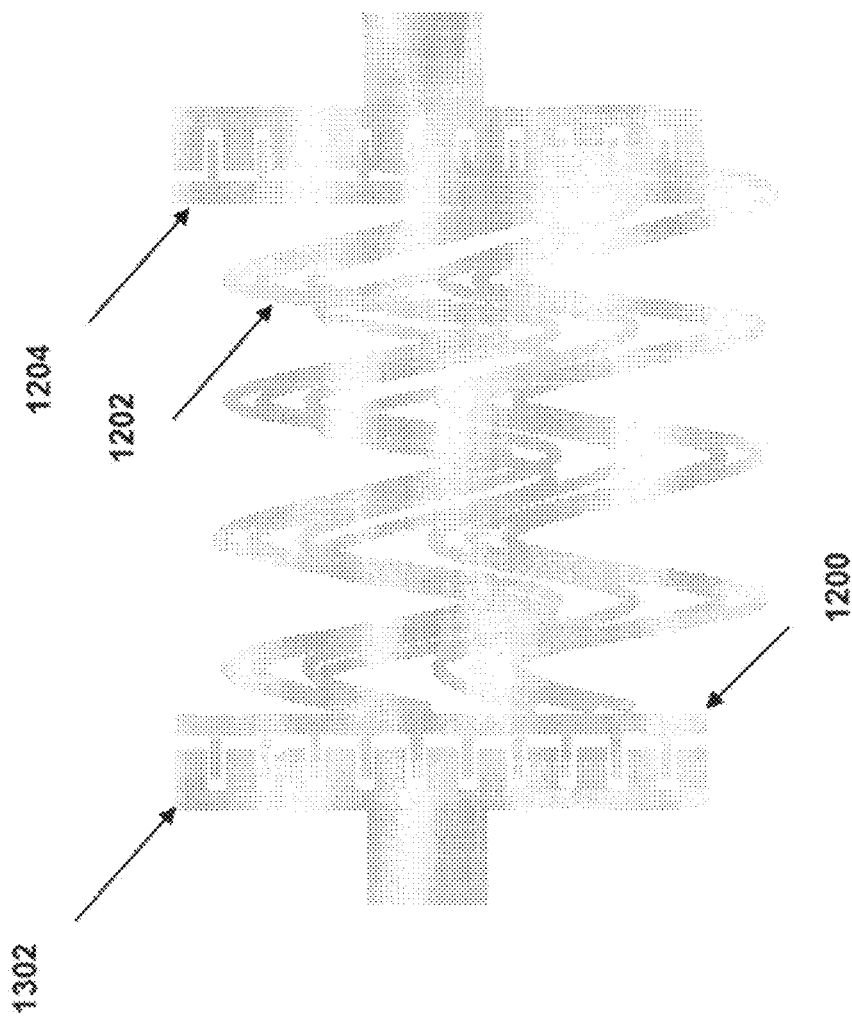

FIG. 14 illustrates another embodiment with multiple spring structures 1202.

In an embodiment, a filter may include sub-micron elements consisting of a curvature of a spring structure.

Figure 15:
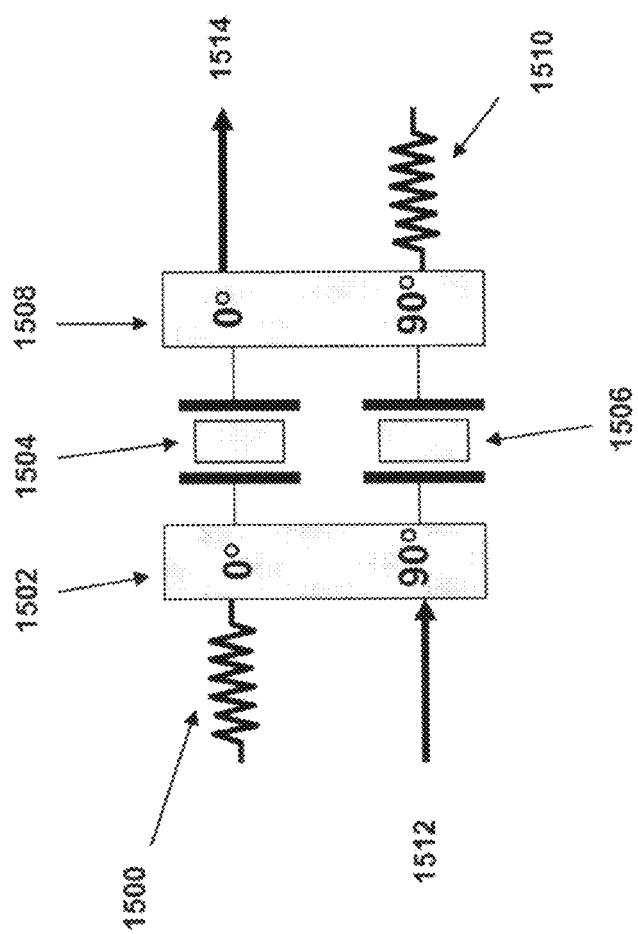
FIG. 15 illustrates an alternate circuit design for utilizing an embodiment of the resonators described herein.

FIG. 15 illustrates a circuit architectural design that can be used with the filter of the present invention. This circuit design lessens the power levels to half by using two filters 1504, 1506 in parallel. This design includes a 0-90 degree splitter 1502 with an input termination 1500 and a power in port 1512. The 0-90 degree splitter 1502 splits the power into a 0 degree and a 90 degree phase. Thus half the power is inputted to the top filter 1504 and half the power is inputted at 90 degrees to the bottom filter 1506. The power from both filters 1504, 1506 are then combined in phase through 0-90 degree splitter 1508 and exit through the power out port 1514.

Figure 16:
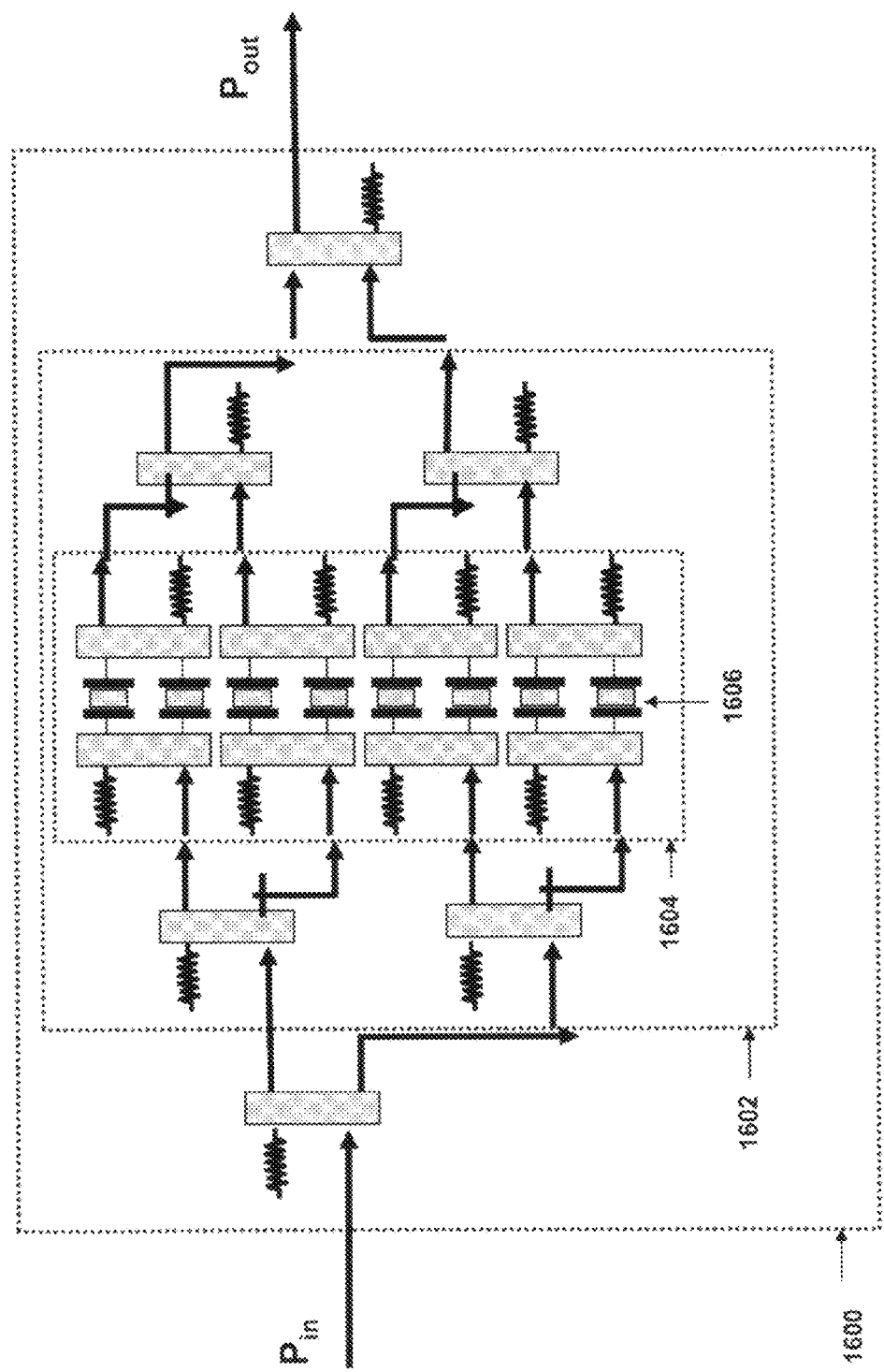
FIG. 16 illustrates yet another circuit design.

FIG. 16 illustrates another embodiment of the circuit architectural design. In this embodiment, a set of eight filters 1606 are within the innermost level 1604. These filters 1606 are fed power by the four 0-90 degree splitters 1502 directly connected to the filters 1606. In turn, the four 0-90 degree splitters in the innermost level 1604, are fed power by the two 0-90 degree splitters 1502 in the middle level 1602. Moreover, the two 0-90 degree splitters 1502 are fed power by the one 0-90 degree splitter 1502 at the outmost level 1600. The same scheme is used to combine the power in phase in the output power process. While this embodiment only has three levels of combination, the invention could utilize more levels to increase the power capacity of the circuit.

Figure 17:
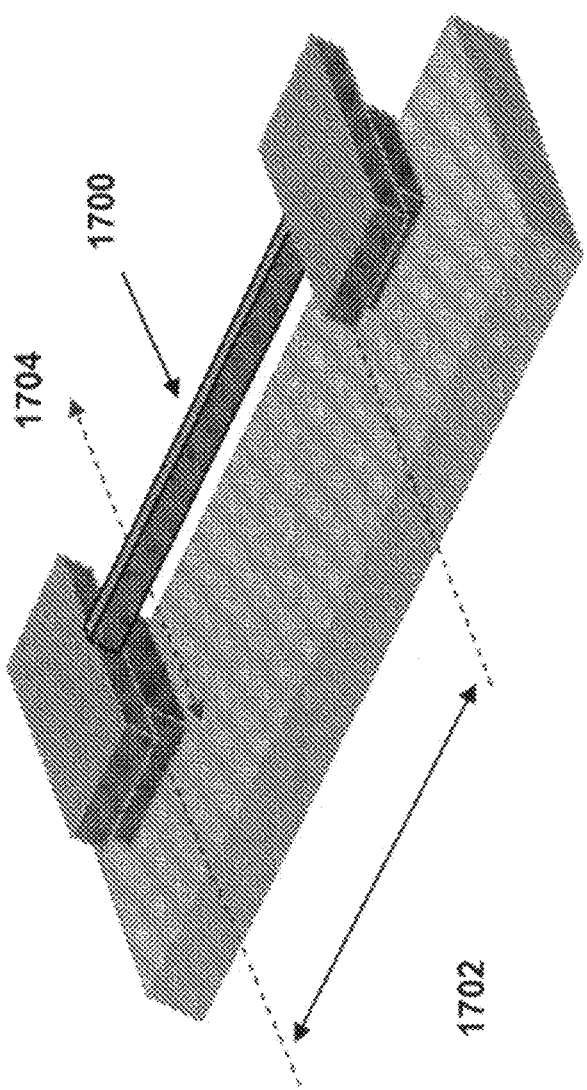
FIG. 17 illustrates a single beam resonator.

FIG. 17 illustrates one embodiment of a beam resonator 1700. This resonator is on silicon and has a thickness 1704 of 100 nanometers, and length 1702 of 10 microns. At these dimensions, this resonator can produce a 10 MHz response. However, if the length 1702 is decreased to 1 micron, the resonator can produce a 1 GHz response.

Figure 18:
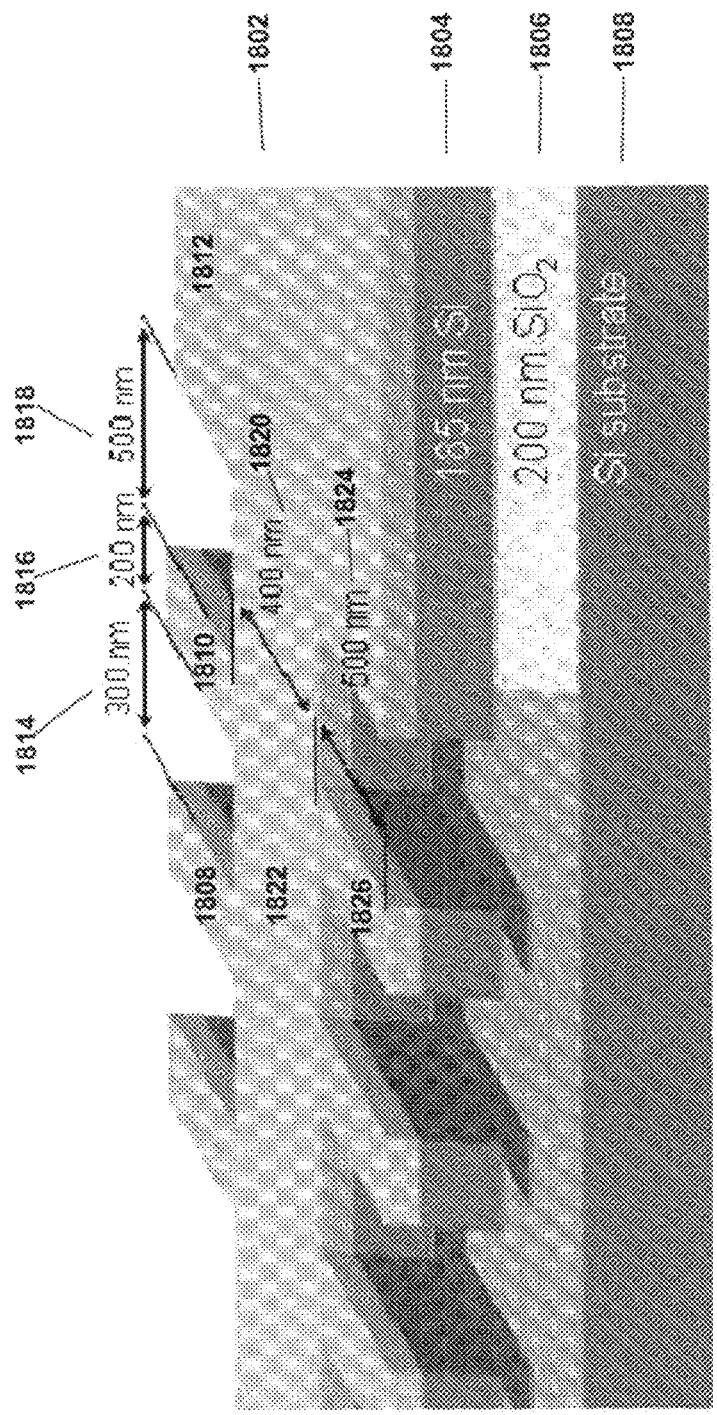
FIG. 18 illustrates a resonator with minor elements.

FIG. 18 illustrates one embodiment similar to the one depicted in FIG. 4. This resonator has a beam with minor elements. The top portion 1802 consists of Au sits on 185 nanometer silicon layer 1804. The silicon layer 1804 in turn is on a 200 nanometer silicon dioxide layer 1806, which in turn is on a silicon substrate 1808. The length 1814 between element 1808 and element 1810 is 300 nanometers in this embodiment. However, the length 1816 of element 1810 is 200 nanometers, while the length 1818 between element 1810 and coupling element 1812 is 500 nanometers. In addition, in this embodiment, the length 1820 of the beam 1822 is 400 nanometers. Moreover, the length 1824 of the element 1826 is 500 nanometers and is similar to the length of elements 1808 and 1810.

FIG. 19 illustrates two more embodiments of beam resonators. A first embodiment 1900 has two doubly clamped beams 1904 joined with a flexible bridge 1906. A second embodiment 1902 has three doubly clamped beams 1908 joined with two flexible bridges 1910.

While staying within the restrictions of the nature of the resonator of the present invention, there are still many different variations possible. These include choice of material. While silicon is still the material of choice for most integrated circuits today, other materials might also be more commercially expedient. Piezoelectrics such as Aluminum Nitride (AlN) has in particular shown much promise because of its intrinsically high stiffness (yielding high frequencies), low-temperature deposition methods, and ease of actuation/detection. Other materials include, but are not limited to, metals, other piezoelectrics (quartz, ZnO), CVD diamond, semiconductors (GaAs, SiGe, Si), superconducting materials, and heterostructures of all kinds (piezoelectric/semiconductor, semiconductor/metal, bimetal, etc.). While the filter described in the embodiments is a bandpass filter, the width of that passband is dependent on the quality factor (Q) of the resonator. By altering the Q so that each filter covers only an individual communications channel, rather than an entire band, one can realize the channel-selection architecture described above. Filters can be operated singly or in massively parallel arrays. These arrays can have at least two different configurations—ones in which every filter is the same, or one in which every filter is different. The first configuration yields benefits in the areas of redundancy and power handling, while the second allows for frequency selectivity via a single contact. In addition, an array incorporating both concepts is also possible. The filters can be operated in a variety of ways, including piezoelectric, magnetomotive, magnetostatic, electrostatic capacitive transduction, optical, thermoelastic, thermomechanical, and piezoresistive. These methods can be used both in actuation and detection.

The resonator of the present invention can be used in sets to produce a filter. In addition, the resonator can be used in a duplexer consisting of two sets of filters (receive and transmit), switches and for receive/transmit isolation. The invention can also be used for timing oscillators with a resonator and a phase locked loop element. Moreover, the invention can be used to create mixing element with coupled resonators of different frequencies. Furthermore, the invention can be used to create a switch with a resonator in a non-linear regime.

Additionally, the nano electromechanical filter can be used many types of devices. For example, the filter may be used in, but limited to, cellular phones, PDAs, personal computers, RFID tracking devices, GPS receivers, wireless-enabled appliances and peripherals (printers, digital cameras, household appliances), satellite communications, radar communications, miniaturized communications platforms, satellite radio receivers (Sirius/XM), military communications platforms, interplanetary space probes, encrypted safety identification, MEMS device communication/control (e.g. biocompatible medical micro/nanobots controlled via integrated RF transceivers).

The previous description of the disclosed embodiments is provided to enable those skilled in the art to make or use the present invention. Various modifications to these embodiments will be readily apparent to those skilled in the art and generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An integrated circuit filter, the filter comprising:
   a silicon substrate;
   a sacrificial layer on the silicon substrate;
   a device layer on the sacrificial layer and including at least one resonator, wherein the at least one resonator includes sub-micron excitable elements and wherein the at least one resonator possesses a fundamental mode frequency as well as a collective mode frequency and wherein the collective mode frequency of the at least one resonator is determined by the fundamental frequency of the submicron excitable elements.

2. The filter of claim 1, wherein the at least one resonator comprises a first resonator and a second resonator connected to the first resonator by a connector.

3. The filter of claim 2, wherein the connector is electrical in characteristic.

4. The filter of claim 2, wherein a collective mode frequency of the second resonator is different than a collective mode frequency of the first resonator.

5. The filter of claim 2, wherein the second resonator is selected from the group consisting of mechanical, electrical, magnetic, optical and piezoelectric.

6. The filter of claim 2, wherein the first resonator and the second resonator in combination create a filter with an operational frequency between 10 MHz-100 GHz.

7. The filter of claim 2, wherein the connector between the first resonator and the second resonator is selected from the group consisting of capacitive, electrostatic, optical, thermomechanical, magnetic, piezoelectric/resistive, and eletrodynamic.

8. The filter of claim 1, wherein the sub-micron excitable elements vibrate in a mode selected from the group consisting of flexural, torsional shear, and longitudinal.

9. The filter of claim 1, wherein the sub-micron excitable elements vary in size and fundamental mode frequency to determine more than one collective mode frequency.

10. The filter of claim 1, in combination with at least one additional filter to form a bank of filters of similar frequency response.

11. The filter of claim 1, in combination with at least one additional filter operating at multiple frequency bands.

12. The filter of claim 1, in combination with at least one additional filter operating at similar frequency bands.

13. The filter of claim 1, wherein an operational frequency response of the filter is selected from the group consisting of: high pass, low pass, band pass, notch, and arbitrary.

14. The filter of claim 1, wherein the sacrificial layer is patterned to suspend the at least one resonator above the substrate.

15. The filter of claim 1, wherein the sub-micron excitable elements are excited by a transduction mechanism selected from the group consisting of piezoelectric, magnetomotive, magnetostatic, electrostatic capacitive transduction, optical, thermoelastic, thermomechanical, and piezoresistive.

16. The filter of claim 1, wherein the at least one resonator comprises a plurality of sub-micron excitable elements arranged along a length of the at least one resonator.

17. The filter of claim 1, wherein the filter is combined with other electronic elements within an integrated circuit.

18. The filter of claim 1, wherein the at least one resonator is suspended above the silicon substrate.

19. An integrated circuit filter, the filter comprising:
   a silicon substrate;
   a sacrificial layer coupled to the silicon substrate;
   a device layer, wherein the sacrificial layer is at least partially between the silicon substrate and the device layer, and wherein the device layer comprises at least one resonator, wherein the at least one resonator includes sub-micron excitable elements having a fundamental mode frequency and wherein the at least one resonator possesses a collective mode frequency determined by the fundamental mode frequency of the submicron excitable elements,
   wherein the sub-micron excitable elements vary in size and fundamental mode frequency to determine more than one collective mode frequency of the at least one resonator,
   wherein the more than one collective mode frequency can be combined to generate a desired filter response.

* * * * *